(12) United States Patent
Qiu

(10) Patent No.: US 11,470,885 B2
(45) Date of Patent: Oct. 18, 2022

(54) POWER SUPPLY DRIVE MODULE, POWER SUPPLY DEVICE AND ELECTRONIC CIGARETTE

(71) Applicant: Changzhou Patent Electronic Technology Co., LTD., Changzhou (CN)

(72) Inventor: Weihua Qiu, Changzhou (CN)

(73) Assignee: CHANGZHOU PATENT ELECTRONIC TECHNOLOGY CO., LTD., Changzhou (CN)

( * ) Notice: Subject to any disclaimer, the term of this patent is extended or adjusted under 35 U.S.C. 154(b) by 372 days.

(21) Appl. No.: 16/628,660

(22) PCT Filed: Dec. 13, 2017

(86) PCT No.: PCT/CN2017/115809
§ 371 (c)(1),
(2) Date: Jan. 3, 2020

(87) PCT Pub. No.: WO2019/006991
PCT Pub. Date: Jan. 10, 2019

(65) Prior Publication Data
US 2020/0146354 A1    May 14, 2020

(30) Foreign Application Priority Data
Jul. 3, 2017    (CN) .......................... 201720792868.9

(51) Int. Cl.
*A24F 40/50*    (2020.01)
*H02M 3/158*    (2006.01)
(Continued)

(52) U.S. Cl.
CPC .............. *A24F 40/50* (2020.01); *A24F 40/40* (2020.01); *A24F 40/51* (2020.01); *H02J 7/0045* (2013.01);
(Continued)

(58) Field of Classification Search
CPC .......... A24F 40/50; A24F 40/40; A24F 40/51; A24F 40/90; H02J 7/0045; H02J 7/025;
(Continued)

(56) References Cited

U.S. PATENT DOCUMENTS 7,876,080 B2    1/2011  Dwarakanath et al.
2008/0238392 A1*  10/2008  Cheung ............... H02M 3/1584
                                                            323/283
(Continued)

FOREIGN PATENT DOCUMENTS

CN    201947177 U    8/2011
CN    205922901 U    2/2017
(Continued)

*Primary Examiner* — Metasebia T Retebo
(74) *Attorney, Agent, or Firm* — Cheng-ju Chiang

(57) ABSTRACT

Provided are a power supply drive module, a power supply device and an electronic cigarette, falling within the technical field of electronics. Wherein a first end of the logic controller is connected to a pulse width modulation pin, a second end is connected to a control electrode of the first transistor, and a third end is connected to a control electrode of the second transistor; a first electrode of the first transistor is connected to a voltage input pin, and a second electrode is connected to a switch pin; and a first electrode of the second transistor is connected to the switch pin, and a second electrode is connected to a ground pin. The power supply drive module includes various components integrated on the substrate, so that the volume of the entire power supply drive module is smaller.

12 Claims, 2 Drawing Sheets

(51) Int. Cl.
*A24F 40/51* (2020.01)
*H02J 7/00* (2006.01)
*H02M 1/088* (2006.01)
*H02M 1/32* (2007.01)
*H03K 17/687* (2006.01)
*A24F 40/40* (2020.01)
*A24F 40/90* (2020.01)

(52) U.S. Cl.
CPC ............ *H02M 1/088* (2013.01); *H02M 1/32* (2013.01); *H02M 3/158* (2013.01); *H03K 17/6871* (2013.01); *A24F 40/90* (2020.01)

(58) Field of Classification Search
CPC ........ H02J 7/0027; H02M 1/088; H02M 1/32; H02M 3/158; H02M 1/38; H02M 3/155; H02M 3/335; H03K 17/6871; H03K 17/687
See application file for complete search history.

(56) References Cited

U.S. PATENT DOCUMENTS

| | | | |
|---|---|---|---|
| 2009/0167267 A1 | 7/2009 | Dwarakanath et al. | |
| 2010/0002472 A1* | 1/2010 | Brohlin | H02M 3/158 363/21.1 |
| 2010/0079175 A1* | 4/2010 | Qiu | H02M 3/1584 327/295 |
| 2015/0173124 A1* | 6/2015 | Qiu | A24F 40/60 131/328 |
| 2019/0159523 A1 | 5/2019 | Qiu | |

FOREIGN PATENT DOCUMENTS

| | | | |
|---|---|---|---|
| CN | 206137198 U | * | 5/2017 |
| EP | 3041120 A1 | | 7/2016 |

* cited by examiner

POWER SUPPLY DRIVE MODULE, POWER SUPPLY DEVICE AND ELECTRONIC CIGARETTE

CROSS REFERENCE TO RELATED APPLICATION

This application is a 35 U.S.C. § 371 National Phase conversion of International (PCT) Patent Application No. PCT/CN2017/115809, filed on Dec. 13, 2017, which claims the priority of Chinese Patent Application No. 201720792868.9, filed on Jul. 3, 2017. The contents of the above-identified applications are incorporated herein by reference. The PCT International Patent Application was filed and published in Chinese.

TECHNICAL FIELD

The present invention relates to the technical field of electronics, in particular to a power supply drive module, a power supply device and an electronic cigarette.

BACKGROUND

The electronic cigarette is an electronic product mimicking a cigarette, and the cigarette material such as nicotine can be converted into steam by means of atomization and other means for a user to suck the cigarette material.

In the related art, the electronic cigarette is mainly composed of an atomizer and a battery device, the circuit board is arranged in the battery device, and various control circuits are integrated on the circuit board. The control circuit generally includes a master processor, a charging module and a power supply drive module. The power supply drive module is configured to provide a driving current for the atomizer under the control of the master processor. In particular, the power supply drive module generally includes a plurality of discrete components arranged on a circuit board, the area of the circuit board occupied by the plurality of discrete components is large, and heat dissipation of devices on the circuit board is not facilitated.

SUMMARY OF THE UTILITY MODEL PRESENT INVENTION

The present invention provides a power supply drive module, a power supply device and an electronic cigarette in order to solve the problem that a power supply drive module occupies a large circuit board area and is not conducive to heat dissipation of devices in the related art. The technical solution is as follows:

In a first aspect, a power supply drive module is provided, the power supply drive module includes:

a substrate, a logic controller, a first transistor, and a second transistor integrated on the substrate;

a first terminal of the logic controller is connected to a pulse width modulation pin, a second terminal of the logic controller is connected to a control electrode of the first transistor, a third terminal of the logic controller is connected to a control electrode of the second transistor, and the logic controller is configured to control opening or closing of the first transistor and the second transistor according to a control signal received from the pulse width modulation pin;

the first electrode of the first transistor is connected to the voltage input pin, and the second electrode is connected to the switch pin;

the first electrode of the second transistor is connected to the switch pin, and the second electrode is connected to the ground pin.

Optionally, the power supply drive module further includes: a first AND gate, a second AND gate, a shoot-through protector, a level shifter, a first operational amplifier, and a second operational amplifier;

the first input terminal of the first AND gate is connected to the second terminal of the logic controller, the second input terminal of the first AND gate is connected to the shoot-through protector, the output terminal of the first AND gate is connected to the input terminal of the level shifter, the output terminal of the level shifter is connected to the input terminal of the first operational amplifier, and the output terminal of the first operational amplifier is connected to the control electrode of the first transistor;

the first input terminal of the second AND gate is connected to the third terminal of the logic controller, the second input terminal of the second AND gate is connected to the shoot-through protector, the output terminal of the second AND gate is connected to the input terminal of the second operational amplifier, and the output terminal of the second operational amplifier is connected to the control electrode of the second transistor.

Optionally, the power supply drive module further includes: a filter resistor, a pull-down resistor, and a voltage-stabilizing diode;

one terminal of the filter resistor is connected to the pulse width modulation pin, and another terminal of the filter resistor is connected to the first terminal of the logic controller and is configured to filter an interference signal in the circuit;

one terminal of the pull-down resistor is connected to a control electrode of the straight-shoot-through protector and the second transistor respectively, and another terminal of the pull-down resistor is connected to a ground pin and is configured to stabilize the output voltage;

one terminal of the voltage-stabilizing diode is connected to the power supply pin, and another terminal of the voltage-stabilizing diode is respectively connected to the over-current protection pin and the power supply terminal of the first operational amplifier and is configured to stabilize the voltage.

Optionally, the power supply drive module further includes: a first current detector and a second current detector;

one terminal of the first current detector is configured to be connected to a power supply pin of a digital circuit, another terminal of the first current detector is connected to a forced-continuous-conduction-mode-enable pin, and the forced-continuous-conduction-mode-enable pin is respectively connected to the logic controller and the shoot-through protector;

one terminal of the second current detector is connected to the forced-continuous-conduction-mode-enable pin, and another terminal of the second current detector is connected to a ground pin.

Optionally, both the first transistor and the second transistor are MOS field effect transistors.

In a second aspect, a power supply device is provided, the power supply device including:

a master processor, a first driving module, a second driving module and a power inductor, wherein each driving module is a power supply drive module as claimed in the first aspect;

the pulse width modulation pin of the first driving module is connected to the master processor, the voltage input pin is connected to the power supply power supply, the switch pin is connected to one terminal of the power inductor, and another terminal of the power inductor is connected to the switch pin of the second driving module;

the pulse width modulation pin of the second driving module is connected to the master processor, and the voltage input pin is connected to the atomizer.

Optionally, the power supply device further includes: a charging port, a charging assembly, and a battery assembly;

one terminal of the charging assembly is connected to the charging port, and another terminal of the charging assembly is connected to the battery assembly and is configured to charge the battery assembly.

Optionally, the power supply device further includes: a battery anti-reverse assembly and an electric quantity detection assembly;

two terminals of the battery anti-reverse assembly are respectively connected to the charging assembly and the battery assembly;

one terminal of the electric quantity detection assembly is connected to a connection point between the charging assembly and the battery anti-reverse assembly, and another terminal of the electric quantity detection assembly is connected to the master processor.

Optionally, the power supply device further includes a display module, wherein the display module is connected to the master processor.

Optionally, the circuit board further includes: a key assembly.

The key assembly is connected to the master processor and is configured to control opening or closing of the master processor.

In a third aspect, an electronic cigarette is provided that includes an atomizer, and a power supply device as provided in the second aspect.

The electronic cigarette includes a key assembly connected to the master processor for controlling the opening or closing of the master processor, and setting the operating parameters of the electronic cigarette. The key assembly includes: a power key; and/or a key, configured to reduce output power; and/or a key, configured to increase the output power.

According to the embodiment of the present invention, the power supply drive module, the power supply device and the electronic cigarette are provided, the power supply drive module includes devices which are integrated on the substrate, so that the volume of the whole driving module is small, so that the space occupied on the circuit board of the electronic cigarette is small, the volume of the electronic cigarette circuit board can be effectively reduced, and the heat dissipation of each device on the circuit board is facilitated.

BRIEF DESCRIPTION OF THE DRAWINGS

In order to more clearly illustrate the technical solution in the embodiments of the present invention, reference will now be made briefly to the accompanying drawings, which are to be used in the description of the embodiments, and obviously, the drawings in the following description are merely some embodiments of the invention and other drawings may be obtained from these drawings without the use of the inventive faculty.

DETAILED DESCRIPTION OF THE EMBODIMENTS

In order that the objectives, technical solutions, and advantages of the present invention will become more apparent, a more particular description of the embodiments of the invention will be rendered by reference to the appended drawings.

Figure 1:
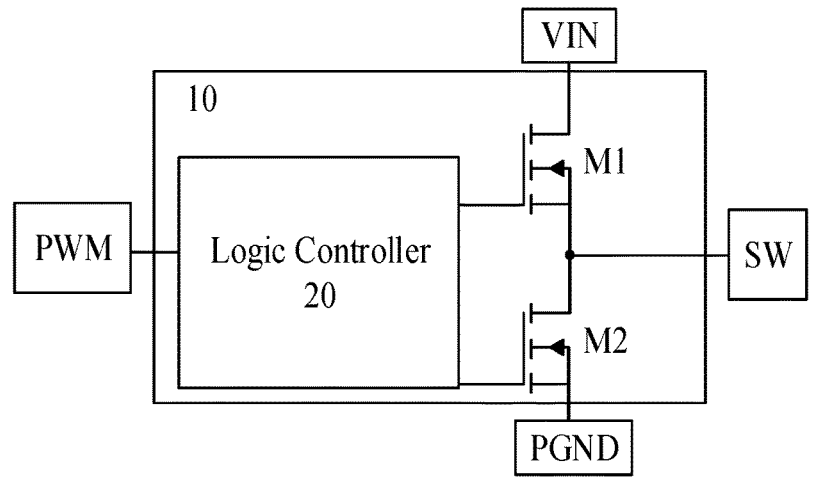
FIG. 1 is a schematic structural view of a power supply drive module according to an embodiment of the present invention.

FIG. 1 is a schematic structural view of a power supply drive module according to an embodiment of the present invention, as shown in FIG. 1, the power supply drive module may include a substrate 10, a logic controller 20, a first transistor M1 and a second transistor M2 integrated on the substrate 10, wherein the substrate 10 may be a silicon substrate.

A first terminal of the logic controller 20 is connected to a pulse width modulated pin PWM, a second terminal is connected to a control electrode of the first transistor M1, a third terminal is connected to a control electrode of the second transistor M2, and the logic controller 20 is configured to receive a control signal sent by a master processor in the electronic cigarette through the pulse width modulated pin PWM, and control opening or closing of the first transistor M1 and the second transistor M2 according to the control signal. In one possible implementation, the master processor may be a microcontroller unit (MCU), and the first transistor M1 and the second transistor M2 may be N-channel Metal Oxide Semiconductor (MOS) transistors.

A first electrode of the first transistor M1 is connected to a voltage input pin VIN, a second electrode is connected to a switch pin SW, a first electrode of the second transistor M2 is connected to the switch pin SW, and a second electrode is connected to a ground pin, for example, which may be connected to a power ground pin PGND. The first electrode of each transistor may be the source, the second electrode may be the drain, and the source and drain of each transistor may be aligned, that is, the first electrode is the drain and the second is the source.

In the embodiment, each pin of the power supply drive module extends out of the power supply module, can be flexibly connected to the power utilization circuit, does not need to be independently welded to set up various discrete components, so it is more convenient and flexible.

When the control signal received by the logic controller 20 is high level, the first transistor M1 can be controlled to be turned on, and the second transistor M2 is controlled to be turned off. At this time, the voltage input pin VIN and the switch pin SW are turned on. If the voltage input pin VIN is connected to the power supply, the switch pin SW is connected to the switch pin SW of another power supply drive module, the supply current provided by the voltage input pin VIN can flow out of the switch pin SW of another power supply drive module through the switch pin SW; If the voltage input pin VIN is connected to the atomizer and the switch pin SW is connected to the switch pin SW of another power supply drive module, after the switch pin SW receives the power supply current output by another power supply drive module, the power supply current can be output to the atomizer from the voltage input pin VIN through the first transistor M1 to drive the atomizer to work.

When the control signal received by the logic controller 20 is low level, the second transistor M2 may be controlled to turn on and control the first transistor M1 to turn off. At this time, the power ground pin PGND and the switch pin SW are turned on, and the switch pin SW is free of current output.

In conclusion, the embodiment of the present invention provides a power supply drive module, the power supply drive module includes devices which are integrated on a substrate, so that the volume of the whole power supply drive module is small, so that the space occupied on the circuit board of the electronic cigarette is small, the heat dissipation of each device on the circuit board is facilitated, and the volume of the electronic cigarette circuit board can be effectively reduced.

Figure 2:
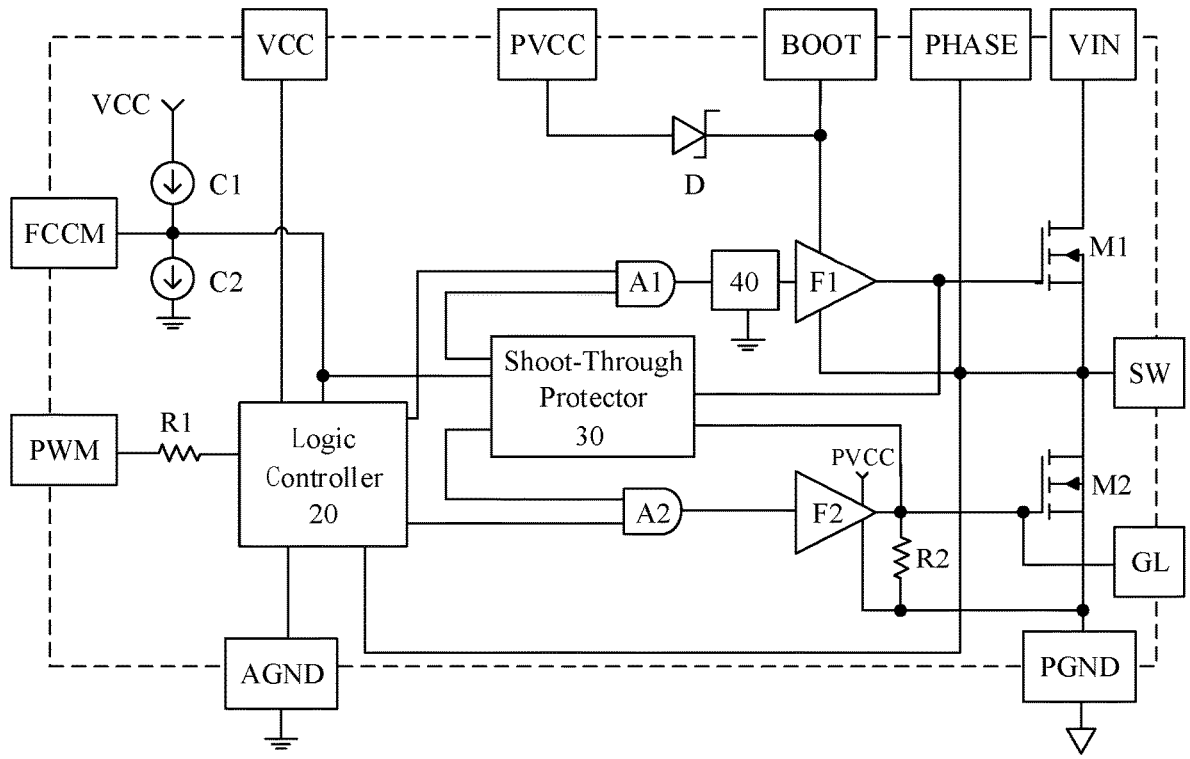
FIG. 2 is a schematic structural view of another power supply drive module according to an embodiment of the present invention.

FIG. 2 is a schematic structural view of another power supply drive module according to an embodiment of the present invention, as shown in FIG. 2, the power supply drive module further including: a first AND gate A1, a second AND gate A2, a Shoot-through protector 30, a level shifter 40, a first operational amplifier F1, and a second operational amplifier F2.

A first input terminal of the first AND gate A1 is connected to a second terminal of the logic controller 20, a second input terminal of the first AND gate A1 is connected to the shoot-through protector 30, an output terminal of the first AND gate A1 is connected to an input terminal of the level shifter 40, an output terminal of the level shifter 40 is connected to an input terminal of the first amplifier F1, and an output terminal of the first amplifier F1 is connected to a control electrode of the first transistor M1.

A first input terminal of the second AND gate A2 is connected to a third terminal of the logic controller 20, a second input terminal of the second AND gate A2 is connected to the shoot-through protector 30, an output terminal of the second AND gate A2 is connected to an input terminal of the second amplifier F2, and an output terminal of the second amplifier F2 is connected to a control electrode of the second transistor M2.

The shoot-through protector 30 is configured to protect the power supply drive module, so that the situation that the current in the power supply drive module is too large to be burnt out is avoided. The level shifter 40 is configured to adjust output phase of the current so as to switch the high and low levels, and the first operational amplifier F1 and the second amplifier F2 are respectively configured to pull the voltage.

Further, the power supply drive module may further include a filter resistor R1, a pull-down resistor R2, and a voltage-stabilizing diode D.

One terminal of the filter resistor R1 is connected to the pulse width modulated pin PWM, and another terminal of the filter resistor R1 is connected to the first terminal of the logic controller 20. The filter resistor R1 can be configured to filter an interference signal in the circuit, prevent the interference of the front-stage circuit from the back-stage circuit, and the resistance value of the filter resistor R1 can be 10 kilo-ohms (KΩ).

One terminal of the pull-down resistor R2 is connected to a control electrode of the shoot-through protector 30 and the second transistor M2, respectively, and another terminal of the pull-down resistor R2 is connected to a ground pin, for example, connected to the power ground pin PGND, the pull-down resistor R2 may stabilize the output voltage.

One terminal of the voltage-stabilizing diode D is connected to the power supply pin PVCC, another terminal of the voltage-stabilizing diode D is connected to one power supply terminal of the over-current protection pin BOOT and the first operational amplifier F1, another power supply terminal of the first operational amplifier F1 is connected to the switch pin SW, and the voltage-stabilizing diode D is configured to voltage stabilization.

Optionally, the power supply drive module may further include a first current detector C1 and a second current detector C2.

One terminal of the first current detector C1 is connected to a digital circuit supply pin VCC and another terminal is connected to a forced-continuous-conduction-mode-enable pin FCCM connected to the logic controller 20 and the shoot-through protector 30, respectively;

One terminal of the second current detector C2 is connected to the forced-continuous-conduction-mode-enable pin FCCM, and another terminal of the second current detector C2 is connected to the ground pin.

The first current detector C1 and the second current detector C2 are configured to feed the detected current intensity and current interval through the forced-continuous-conduction-mode-enable pin FCCM to the main controller, which in turn determines whether the logic controller 20 correctly executes the signal output by the main controller.

In an embodiment of the present invention, the detection resolution of the two current detectors may be selected according to product application requirements, e.g., the detection resolution of the two current detectors may be 50 microamps (μA).

In addition, as can be seen in FIG. 2, one power terminal of the second operational amplifier F2 is connected to the power supply pin PVCC and another power terminal is connected to the power ground pin PGND; the logic controller 20 is also connected to the analog ground pin AGND. The power supply drive module further includes a phase voltage pin PHASE which is respectively connected to the switch pin SW and the logic controller 20.

When the power supply drive module works, when the control signal received by the logic controller 20 is high level, the first transistor M1 can be controlled to be turned on, and the second transistor M2 is controlled to be turned off. At this time, the voltage input pin VIN and the switch pin SW are turned on. If the voltage input pin VIN is connected to a power supply, the supply current provided by the voltage input pin VIN can flow out through the switch pin SW to the switch pin SW of another power supply drive module; if the voltage input pin VIN is connected to the atomizer, after the switch pin SW receives the power supply current output by another power supply drive module, the power supply current can be output to the atomizer from the voltage input pin VIN through the first transistor M1 to drive the atomizer to work.

When the control signal received by the logic controller 20 is low level, the second transistor M2 may be controlled to turn on and control the first transistor M1 to turn off. At this time, the pin PGND and the switch pin SW are turned on, and the switch pin SW is free of current output.

In conclusion, the embodiment of the present invention provides a power supply drive module, the power supply drive module includes devices which are integrated on a substrate, so that the volume of the whole power supply drive module is small, so that the space occupied on the circuit board of the electronic cigarette is small, the heat dissipation of each device on the circuit board is facilitated, and the volume of the electronic cigarette circuit board can be effectively reduced.

Figure 3:
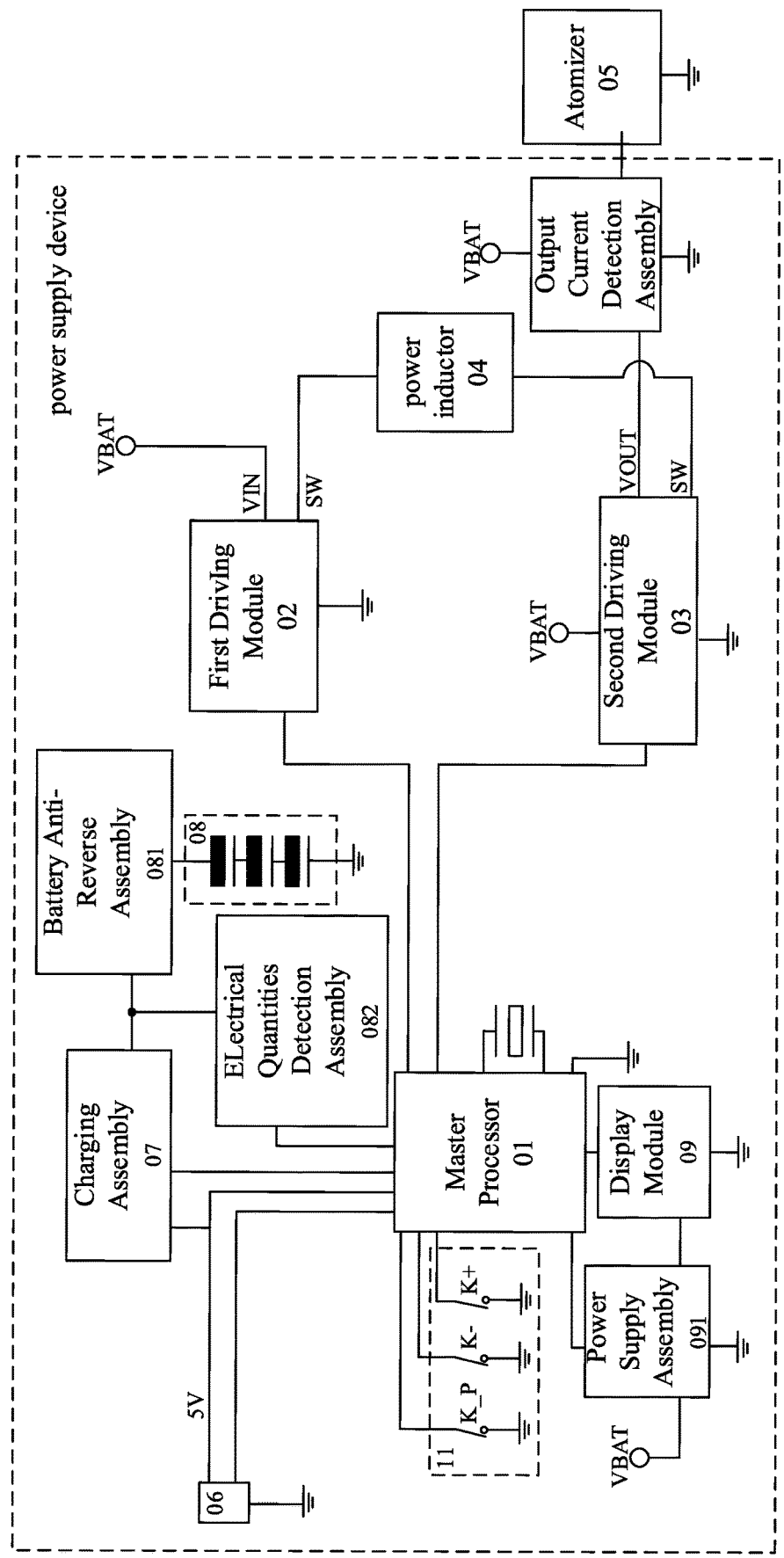
FIG. 3 is a schematic structural view of a power supply device according to an embodiment of the present invention.

FIG. 3 is a schematic structural view of a power supply device according to an embodiment of the present invention, and referring to FIG. 3, the power supply device may include:

a master processor 01, a first driving module 02, a second driving module 03 and a power inductor 04, wherein each of the first driving module 02 and the second driving module 03 can be a power supply drive module as shown in FIG. 1 or FIG. 2, and the master processor 01 can be a microcontroller unit (MCU).

Referring to FIG. 3, the pulse width modulation pin of the first driving module 02 can be connected to the master processor 01, the voltage input pin VIN can be connected to the power supply VBAT, the switch pin SW is connected to one terminal of the power inductor 04, and another terminal of the power inductor 04 is connected to the switch pin SW of the second driving module 03.

The pulse width modulation pin of the second driving module 03 is connected to the master processor 01, and the voltage input pin VOUT is connected to the atomizer 05. For example, the voltage input pin VOUT may be connected to the atomizer 05 via an output current detection assembly.

It is noted that when the power supply drive module shown in FIG. 2 is used as the second driving module 02 in the power supply device shown in FIG. 3, the voltage input pin VIN in the power supply drive module is the voltage input pin VOUT in FIG. 3.

When the power supply device works, the master processor 10 can input a control signal to the pulse width modulated pin PWM of each driving module, and when the control signal is high level, the first transistor in the first driving module 02 and the first transistor in the second driving module 03 are turned on, and the second transistor in the first driving module 02 and the second transistor in the second driving module 03 are turned off. At this time, the supply current supplied by the voltage input pin VIN in the first driving module 02 flows out through the switch pin SW of the first driving terminal module 02, oscillates through the power inductor 04, and then is input to the first transistor in the second driving module 03 via the switch pin SW of the second driving module 03, and finally is output to the atomizer 05 through the voltage input pin VOUT of the second driving module 03.

When the control signal output by the master processor 10 is low level, the second transistor in the first driving module 02 and the second transistor in the second driving module 03 can be controlled to be turned on, the first transistors in the two driving modules are turned off, and the voltage input pin VOUT of the second driving module 03 is free of current output.

By means of the power supply device, the master processor 10 can control the second driving module 03 to output a driving current to the atomizer 05 to drive the atomizer 05 to work by outputting a high-frequency pulse width modulation signal as a control signal.

With continued reference to FIG. 3, the power supply device may further include a charging port 06, a charging assembly 07, and a battery assembly 08, which may be a universal serial bus (USB) port. The USB port may be externally powered and provide a charging voltage of 5 volts (V) for the battery assembly 08.

The charging port 06 can be respectively connected to the master processor 01 and the charging assembly 07, one terminal of the charging assembly 07 is connected to the charging port 05, and another terminal of the charging assembly 07 is connected to the battery assembly 08 for charging the battery assembly 08.

Optionally, the power supply device may further include a battery anti-reverse assembly 081 and an electrical quantities detection assembly 082.

The two terminals of the battery anti-reverse assembly 081 are respectively connected to the charging assembly 07 and the battery assembly 08; and the battery anti-reverse assembly 081 is configured to protect each device in the power supply device when the battery is reversely installed. One terminal of the electricity detection assembly 082 is connected to the connection point between the charging assembly 07 and the battery anti-reverse assembly 081, and another terminal is connected to the master processor 01. For detecting the electric quantity of the battery assembly 08.

The battery assembly 08 may also be connected to the voltage input pin VIN of the first driving module 02 through the battery anti-reverse assembly 081 to serve as a power supply for the first driving module 02.

Further, as shown in FIG. 3, the power supply device may further include a display module 09 connected to the master processor 01. The display module may be an organic light-emitting diode (OLED) display screen, and may also include a power supply assembly 091 for powering the display module 09.

Referring to FIG. 3, the circuit board may further include a key assembly 11 connected to the master processor 01 for controlling the opening or closing of the master processor 01, and a setting of the operating parameters of the electronic cigarette can be realized by the key assembly 11, for example, adjusting the output power, the operating mode, the output voltage, etc.

For example, as shown in FIG. 3, the key assembly 11 may include three keys, where the key K_P may be a power key, the key K− may be a key for reducing the output power, and the key K+ may be a key for increasing the output power.

In summary, the embodiment of the present invention provides a power supply device in which the atomizer is driven by two power supply drive modules; since the two power supply drive modules are integrated devices, the size is small, the occupied area of the power supply device is only one third of the original structure, the heat dissipation of each device on the circuit board is facilitated, and the volume of the electronic cigarette circuit board can be reduced.

Embodiments of the present invention also provide an electronic cigarette, which may include an atomizer 05, and a power supply device as shown in FIG. 3, which may be configured to drive the atomizer 05.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power supply drive module, wherein the power supply drive module comprises:
a substrate, a logic controller, a first transistor and a second transistor, wherein the logic controller, the first transistor and the second transistor are integrated on the substrate;
a first terminal of the logic controller is connected to a pulse width modulation pin, a second terminal of the logic controller is connected to a control electrode of the first transistor, a third terminal of the logic controller is connected to a control electrode of the second transistor, and the logic controller is configured to control opening or closing of the first transistor and the second transistor according to a control signal received from the pulse width modulation pin;

a first electrode of the first transistor is connected to a voltage input pin, a second electrode is connected to a switch pin; and a first electrode of the second transistor is connected to the switch pin, and a second electrode is connected to a ground pin;

wherein the power supply drive module further comprises: a first AND gate, a second AND gate, a shoot-through protector, a level shifter, a first operational amplifier, a second operational amplifier, a first current detector and a second current detector;

a first input terminal of the first AND gate is connected to the second terminal of the logic controller, a second input terminal of the first AND gate is connected to the shoot-through protector, an output terminal of the first AND gate is connected to an input terminal of the level shifter, an output terminal of the level shifter is connected to an input terminal of the first operational amplifier, and an output terminal of the first operational amplifier connected to the control electrode of the first transistor;

a first input terminal of the second AND gate is connected to the third terminal of the logic controller, a second input terminal of the second AND gate is connected to the shoot-through protector, an output terminal of the second AND gate is connected to an input terminal of the second operational amplifier, and an output terminal of the second operational amplifier is connected to the control electrode of the second transistor;

one terminal of the first current detector is configured to be connected to a power supply pin of a digital circuit, another terminal of the first current detector is connected to a forced-continuous-conduction-mode-enable pin, the forced-continuous-conduction-mode-enable pin is connected to the logic controller and the shoot-through protector respectively;

one terminal of the second current detector is connected to the forced-continuous-conduction-mode-enable pin, and another terminal of the second current detector is connected to the ground pin.

2. The power supply drive module of claim 1, wherein the power supply drive module further comprises: a filter resistor, a pull-down resistor, and a voltage-stabilizing diode;

one terminal of the filter resistor is connected to the pulse width modulation pin, and another terminal of the filter resistor is connected to the first terminal of the logic controller and is configured to filter an interference signal in the circuit;

one terminal of the pull-down resistor is connected to the shoot-through protector and the control electrode of the second transistor respectively, and another terminal of the pull-down resistor is connected to the ground pin and is configured to stabilize output voltage;

one terminal of the voltage-stabilizing diode is connected to the power supply pin, and another terminal of the voltage-stabilizing diode is connected to an over-current protection pin and a power supply terminal of the first operational amplifier respectively, and is configured to stabilize voltage.

3. The power supply drive module of claim 1, wherein the first transistor and the second transistor are both metal oxide semiconductor field effect transistors.

4. A power supply device, wherein the power supply device comprises a master processor, a first driving module, a second driving module and a power inductor, wherein each driving module is the power supply drive module as claimed in claim 1;

the pulse width modulation pin of the first driving module is connected to the master processor, the voltage input pin is connected to a power supply, the switch pin is connected to one terminal of the power inductor, another terminal of the power inductor is connected to the switch pin of the second driving module, the pulse width modulation pin of the second driving module is connected to the master processor, and the voltage input pin is connected to an atomizer.

5. The power supply device of claim 4, wherein the power supply device further comprises: a charging port, a charging assembly, and a battery assembly;

one terminal of the charging assembly is connected to the charging port and another terminal is connected to the battery assembly for charging the battery assembly.

6. The power supply device of claim 5, wherein the power supply device further comprises: a battery anti-reverse assembly and an electric quantity detection assembly;

two terminals of the battery anti-reverse assembly are respectively connected to the charging assembly and the battery assembly;

one terminal of the electric quantity detection assembly is connected to a connection point between the charging assembly and the battery anti-reverse assembly, and another terminal of the electric quantity detection assembly is connected to the master processor.

7. The power supply device of claim 4, wherein the power supply device further comprises: a display module, connected to the master processor.

8. An electronic cigarette, wherein the electronic cigarette comprises an atomizer and a power supply device as claimed in claim 4;

the power supply device is configured to drive the atomizer.

9. The power supply device of claim 5, wherein the power supply device further comprises: a display module, connected to the master processor.

10. The power supply device of claim 6, wherein the power supply device further comprises: a display module, connected to the master processor.

11. The electronic cigarette of claim 8, wherein the electronic cigarette comprises a key assembly connected to the master processor for controlling the opening or closing of the master processor, and setting the operating parameters of the electronic cigarette.

12. The electronic cigarette of claim 11, wherein the key assembly comprises:

a power key; and/or a key, configured to reduce output power; and/or a key, configured to increase the output power.

* * * * *